United States Patent
Watanabe

(10) Patent No.: US 7,078,751 B2
(45) Date of Patent: Jul. 18, 2006

(54) SOLID-STATE IMAGING DEVICE

(75) Inventor: Takashi Watanabe, Souraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/610,714

(22) Filed: Jun. 30, 2003

(65) Prior Publication Data

US 2004/0004254 A1    Jan. 8, 2004

(30) Foreign Application Priority Data

Jul. 2, 2002    (JP) ............................. 2002-193386

(51) Int. Cl.
*H01L 31/62* (2006.01)
*H01L 31/113* (2006.01)
(52) U.S. Cl. ........................... 257/292; 257/59; 257/72
(58) Field of Classification Search .............. 257/59, 257/72, 292
See application file for complete search history.

(56) References Cited

U.S. PATENT DOCUMENTS 5,386,135 A * 1/1995 Nakazato et al. ........... 257/369
6,169,318 B1 * 1/2001 McGrath ..................... 257/445
6,448,104 B1   9/2002 Watanabe ..................... 438/60

FOREIGN PATENT DOCUMENTS

JP    58-097972   *  6/1983   ................. 257/292
JP    11-307753      11/1999

* cited by examiner

*Primary Examiner*—Howard Weiss

(74) *Attorney, Agent, or Firm*—David G. Conlin; David A. Tucker; Edwards Angell Palmer & Dodge LLP

(57) ABSTRACT

The sources or drains 14 of transistors and photodiodes 13, which constitute shaded pixels covered with a shading layer 16, are formed on a surface of a highly doped well 20 provided on a lowly doped substrate 11. Therefore, a potential barrier $\Delta V$ is formed extended from the lowly doped substrate 11 toward the highly doped well 20. Even if intense spot light is made incident on some of light-receiving pixels and part of light 17 reaches a neutral region of the lowly doped substrate 11, part of diffused charges 18 photoelectrically converted there cannot intrude into the highly doped well 20. Therefore, an output signal level of the shaded pixels does not change, and a black reference level can be maintained.

10 Claims, 5 Drawing Sheets

SOLID-STATE IMAGING DEVICE

BACKGROUND OF THE INVENTION

The present invention relates to a solid-state imaging device capable of preventing black reference level fluctuations by shaded pixels.

There is proposed a MOS type solid-state imaging device in which each pixel is provided with a light-receiving section having a photodiode or one or a plurality of MOS (metal-oxide semiconductor) transistors and a scanning circuit formed in the vicinity of this light-receiving section and which reads image data by the scanning circuit. FIG. 3 shows one exemplary circuit diagram of the solid-state imaging device in which the pixels are two-dimensionally arranged.

In FIG. 3, there are shown pixels 21 and vertical read control lines 22 to be driven by a vertical reading circuit 23. There are also shown output signal lines 24, which are connected to a common signal line 27 via noise canceler circuits 25 and horizontal selector switches 26 provided for each column. The horizontal selector switches 26 are driven by a horizontal read circuit 28. The reference numeral 29 denotes an amplifier.

FIG. 4 shows the detailed construction of the pixel 21. As the structure of the pixel 21, there are known a structure that has one photodiode and one MOS transistor (FIG. 4A), a structure that has one photodiode and three MOS transistors (FIG. 4B), a structure that has one photodiode and four MOS transistors (FIG. 4C) and so on. In these cases, there are shown a photodiode 31, a pixel select transistor 32, an amplify transistor 33, a reset transistor 34 and a transfer transistor 35. That is, in the pixel structure shown in FIG. 4A, only selection of a photodiode signal is performed. In the pixel structure shown in FIG. 4B, the photodiode signal is read after being amplified by the amplify transistor 33. In the pixel structure shown in FIG. 4C, sensitivity is improved by separating the photodiode 31 from the detector section by the transfer transistor 35.

In FIG. 3, a plurality of columns located on the left-hand side in a pixel array are covered with a shading layer 30. Therefore, a black reference level can be obtained from an output of the pixels (shaded pixels) 21 covered with the shading layer 30. That is, a video signal is generally outputted by AC coupling, and on this occasion, a reference level for outputted video signal is indispensable. The output of the shaded pixels provides this reference level.

Moreover, the transistors 32, 33, 34 and 35 in the pixel 21 are required to be as small as possible, and the substrate concentration under the transistors 32, 33, 34 and 35 are required to be increased for the above purpose. On the other hand, it is required to expand a depletion layer under the photodiode 31 as far as possible in order to improve the sensitivity of the photodiode 31. Then, the substrate concentration under the photodiode 31 must be reduced for the above purpose.

In order to satisfy the aforementioned requirements, there is proposed a CMOS (complementary type metal oxide film semiconductor) type solid-state imaging device in which a well of a concentration higher than that of the substrate is formed of a conductive type identical to that of the substrate on the lowly doped substrate, a transistor is formed on the highly doped well, and a photodiode is formed on the lowly doped substrate (Japanese Patent Laid-Open Publication No. HEI 11-307753). FIG. 5 shows the structure of this CMOS type solid-state imaging device. In this case, there are shown a lowly doped substrate 1, a highly doped well 2, a photodiode 3, a source or drain 4 of a transistor, and the gate of the transistor 5. A plurality of pixels, which are arranged on the left-hand side in the figure and constructed of transistors and the photodiodes 3 are covered with a shading layer 6, and an output signal from the shaded pixels covered with this shading layer 6 is served as the black reference level.

However, the conventional CMOS type solid-state imaging devices have the problems as follows. That is, as described above, in the CMOS type solid-state imaging device shown in FIG. 5, the level of the output signal from the shaded pixel covered with the shading layer 6 is served as the black reference level. In the above case, if intense spot light is made incident on some of the light-receiving pixels that are not covered with the shading layer 6, then part of light 7 reaches the neutral region of the lowly doped substrate 1. Then, a minority of carriers 8, which are photoelectrically converted there, out of electric charges diffuse and expand in all directions. Thus, part of these diffused charges 8 reaches the photodiodes 3 of the shaded pixels, consequently raising the output signal level of the shaded pixel. As a result, the output signal level of the shaded pixels becomes unable to serve as the black reference level.

If this phenomenon is observed on a pickup image screen, the result is shown in FIG. 6. In this case, FIG. 6A shows the pickup image screen. FIG. 6B shows an image signal in a portion $L_4$–$L_4'$ of the pickup image screen shown in FIG. 6A, where the horizontal axis represents a distance along $L_4$–$L_4'$, and the vertical axis represents the output level. As shown in FIG. 6A, there appears a false signal of a belt-shaped black debased image in the horizontal direction from the position of the spot light 9. As shown in FIG. 6B, the minority of carriers generated in the region of the intense spot light 9 diffuse and reach the neighborhood shaded pixels, pulling up the signal level located there. Normally, with regard to the video signal, the DC level of the light-receiving pixel signal is determined with respect to the shaded pixel signal per each horizontal line. Therefore, the level of the light-receiving pixel signal become reduced by the level of the shaded pixel signal in horizontal lines, and this cause a black debased image (hereinafter expressed as "depressed in black") in a belt-like shape in the horizontal direction on the pickup image screen 6A.

SUMMARY OF THE INVENTION

Accordingly, the object of the present invention is to provide a solid-state imaging device capable of preventing black reference level fluctuations due to shaded pixels and reducing a depression-in-black phenomenon due to intense spot light.

In order to achieve the above object, in a solid-state imaging device of the present invention, a lower side of the photodiode of the shaded pixel facing the semiconductor substrate is covered with an impurity layer that is a conductive type identical to that of the semiconductor substrate and has a concentration higher than that of the semiconductor substrate, and a lower side of the photodiode of the light-receiving pixel facing the semiconductor substrate is put in direct contact with the semiconductor substrate.

Therefore, the impurity layer has a potential barrier against the semiconductor substrate. Therefore, even if a minority of carriers generated there diffuse in the semiconductor substrate and reach the region of the shaded pixels when intense spot light is applied to the light-receiving pixels, the carriers cannot reach the photodiodes of the shaded pixels due to the potential barrier. As a result, the level of the shaded pixel signal outputted from the shaded pixels does not change due to the diffusion of the minority of carriers, and also the DC level of the light-receiving pixel signal with respect to this shaded pixel signal does not change. Therefore, even if intense spot light is applied to the light-receiving pixels, the depression-in-black phenomenon does not occur in the horizontal direction from the position of the spot light on the pickup image screen.

In one embodiment of the present invention, in addition to the lower side of the photodiode of the shaded pixel, a lower side of the transistor of the shaded pixel facing the semiconductor substrate is covered with the impurity layer, and a lower side of the transistor of the light-receiving pixel facing the semiconductor substrate is covered with another impurity layer that is a conductive type identical to that of the semiconductor substrate and has a concentration higher than that of the semiconductor substrate. With this arrangement, the impurity layer, which covers the lower side of the photodiodes of the shaded pixels, can be formed concurrently with the impurity layer of a concentration higher than that of the semiconductor substrate that originally covers the lower side of the transistors of both the shaded pixels and the light-receiving pixels. This therefore facilitates the formation of the impurity layer that covers the lower side of the photodiodes of the shaded pixels.

In one embodiment of the present invention, the impurity layer that covers the lower side of the shaded pixel has its whole area shaded by a shading layer and is separated from the impurity layer that covers the lower side of the transistor of the light-receiving pixel via a region of the semiconductor substrate. Therefore, no electric charge is generated through photoelectric conversion in the impurity layer that covers the lower side of the shaded pixels. Moreover, the electric charges photoelectrically converted in this impurity layer does not spread by diffusion. Thus, the electric charge inflow to the photodiodes of the shaded pixels is prevented.

In one embodiment of the present invention, the impurity layer that covers the lower side of the photodiode of the shaded pixel is grounded. Therefore, a potential rise in the impurity layer due to a current and so on in the impurity layer by pixel operation is prevented, and the potential barrier against the semiconductor substrate is reliably maintained.

In one embodiment of the present invention, the shading layer that shades the whole area of the impurity layer that covers the lower side of the shaded pixel is grounded. Therefore, the impurity layer can be grounded together with the shading layer in the shading region, and this facilitates grounding the impurity layer.

In one embodiment of the present invention, the shaded pixels are arranged in a direction of column in the vicinity of either one or both of both ends in a direction of row of the light-receiving pixels arranged in a matrix form. Therefore, the shaded pixel signal in the direction of row comes to have a stable reference potential without being influenced by the incident light. Thus, the DC level of the light-receiving pixel signal can be determined in lines.

In one embodiment of the present invention, the shaded pixels are arranged in a direction of row in the vicinity of either one or both of both ends in a direction of column of the light-receiving pixels arranged in a matrix form. Therefore, the shaded pixel signal in the direction of column comes to have a stable reference potential without being influenced by the incident light. Thus, by arranging the shaded pixels in the two directions of row and column, the shaded pixel signal in both the directions can be utilized for purposes other than determining the DC level of the light-receiving pixel signal in lines.

Also, there is provided a solid-state imaging device, wherein at least a superficial portion of the semiconductor substrate facing the photodiode of the shaded pixel is served as an impurity layer that is a conductive type identical to that of the superficial portion and has a concentration higher than that of the superficial portion, and a side of the photodiode of the light-receiving pixel facing the superficial portion is put in direct contact with the superficial portion.

Therefore, the impurity layer has a potential barrier against the superficial portion. Therefore, a well or an epitaxially grown layer is formed on the surface side of the semiconductor substrate to constitute the superficial portion. In the case where the shaded pixels and the light-receiving pixels are formed on the surface of the well or the epitaxially grown layer, the black reference level fluctuations due to intense incident light can be prevented with a simple construction.

In one embodiment of the present invention, the surface portion is a well or an epitaxially grown layer formed on the surface side of the semiconductor substrate. Therefore, in the case where the shaded pixels and the light-receiving pixels are formed on the surface of the well or the epitaxially grown layer, the black reference level fluctuations due to intense incident light can be prevented with a simple construction.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
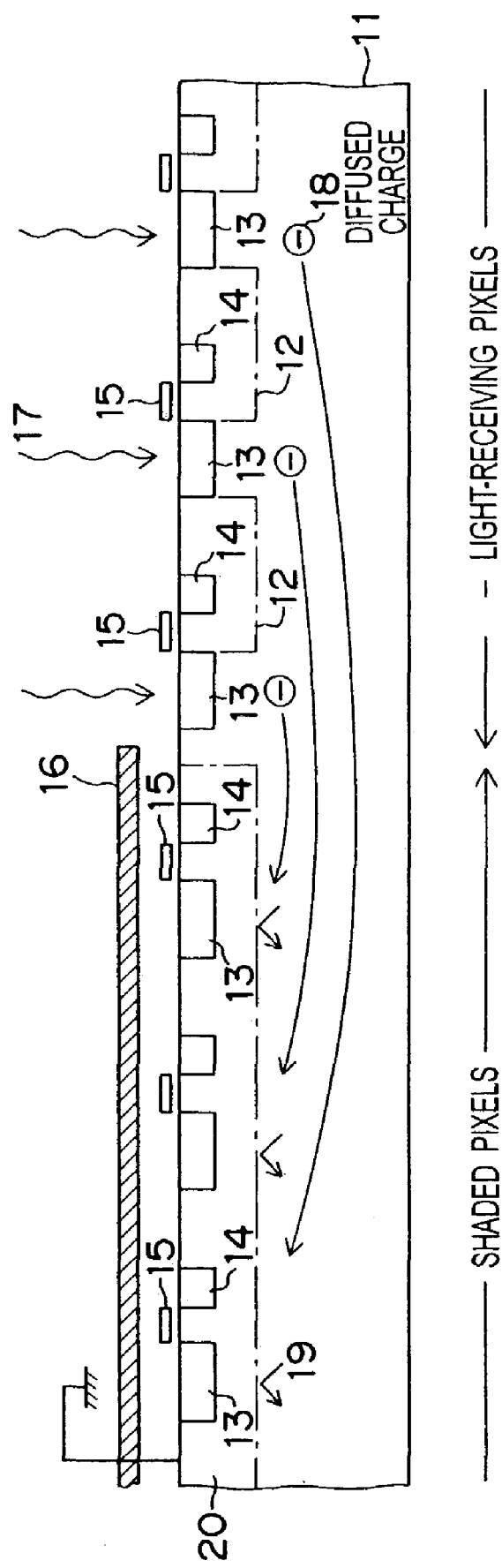
FIG. 1 is a sectional view including shaded pixels and light-receiving pixels located in the neighborhood in a solid-state imaging device of this invention.

This invention will be described in detail below on the basis of the embodiments shown in the drawings. FIG. 1 is a sectional view including shaded pixels and light-receiving pixels located in the neighborhood in the solid-state imaging device of the present embodiment.

In FIG. 1, there are shown a lowly doped substrate 11, highly doped wells 12 and 20, photodiodes 13, sources or drains 14 of transistors and gates 15 of the transistor. Each pixel is constituted of the photodiode 13 and the transistor constructed of the source or drain 14 and the gate 15. A plurality of pixels constituted of the transistors and the photodiodes 13 arranged on the left-hand side in the figure are covered with a shading layer 16, and the level of an output signal from the shaded pixels covered with this shading layer 16 is assumed to be the black reference level.

In the above case, if intense spot light is made incident on some of the light-receiving pixels, which are not covered with the shading layer 16, then part of light 17 reaches the neutral region of the lowly doped substrate 11. Then, a minority of carriers 18 out of the electric charges photoelectrically converted there diffuse and spread in all directions. Thus, some of these diffused charges 18 reach the shaded pixels. However, the photodiodes 13 in the shaded pixels of the present embodiment are covered with the highly doped well 20. This highly doped well 20 has a potential barrier against the lowly doped substrate 11, and therefore, the electric charges 18, which have diffused in the lowly doped substrate 11, cannot intrude into the highly doped well 20 as indicated by arrow 19. Therefore, the diffused charges 18 cannot reach the photodiodes 13 of the shaded pixels, and the output signal level of the shaded pixels does not change. As a result, the black reference level can be maintained.

Figure 2:
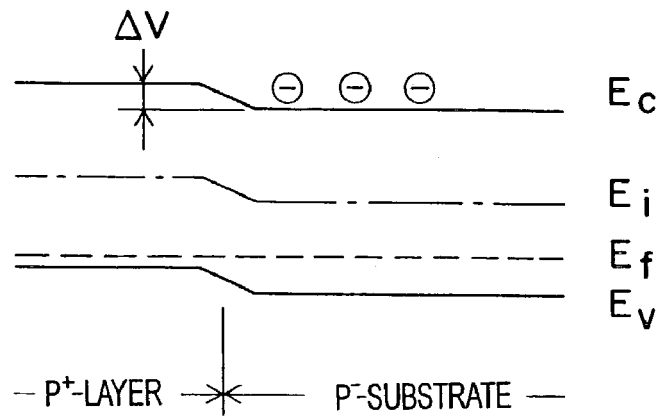
FIG. 2 is an energy band diagram at and around the boundary between a lowly doped substrate and a highly doped well in FIG. 1.
Figure 4A:
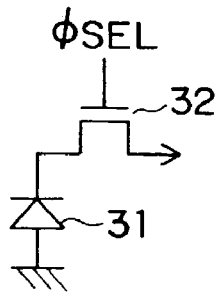
FIGS. 4A, 4B and 4C are views showing one example of the construction of the pixels in FIG. 3.
Figure 4B:
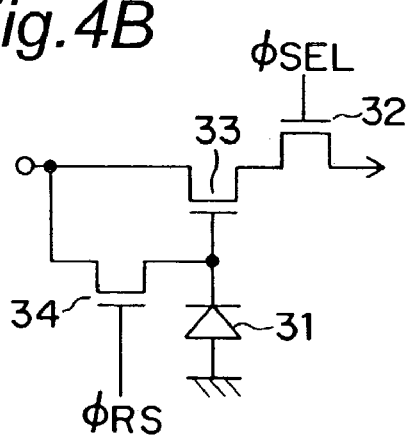
Figure 4C:
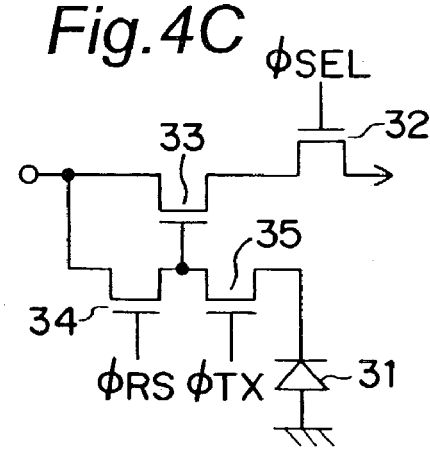

Hereinafter, the aforementioned phenomenon will be described in detail below with reference to FIG. 2. In the following description, the lowly doped substrate 11 and the highly doped wells 12 and 20 are P-type, while the photodiodes 13 and the sources or drains 14 of the transistors are N-type. However, the case of inverse conductive types can also be similarly discussed. FIG. 2 shows an energy band at and around the boundary between the lowly doped substrate 11 and the highly doped wells 12 and 20. In FIG. 2, the lowly doped P$^-$-substrate 11 is located on the right-hand side, the highly doped P$^+$-layers 12 and 20 are located on the left-hand side, and the vertical axis represents potential. There are also shown the energy levels of Ev representing the valence band, Ec representing the conduction band, Ei representing the intrinsic level and Ef representing the Fermi level.

In FIG. 2, with regard to energy viewed from electron, the potential barrier $\Delta V$ expressed by the following equation (1) is formed in a direction from the lowly doped P$^-$-substrate 11 toward the highly doped P$^+$-layers (wells) 12 and 20.

$$\Delta V = (kT/q) \cdot \ln(Npw/Nsub) \quad (1)$$

In this equation,
k: Boltzmans constant,
T: Absolute temperature,
q: Elementary charge,
Npw: Impurity concentration of highly doped P$^+$-layer, and
Nsub: Impurity concentration of lowly doped P$^-$-substrate.

Assuming that Npw=$1\times10^{17}$ and Nsub=$1\times10^{15}$ as one example, then $\Delta V$=120 mV.

An inflow rate R of the diffused charges due to the potential barrier of $\Delta V$ is obtained according to the following equation (2).

$$R = \exp(-\Delta V/(kT/q)) = Nsub/Npw \quad (2)$$

That is, the inflow rate R is reduced in proportion to the impurity concentration ratio of the lowly doped P$^-$-substrate to the highly doped P$^+$-layer. Therefore, in the case of the aforementioned example in which Npw=$1\times10^{17}$ and Nsub=$1\times10^{15}$, the rate is reduced to $1/100$.

In FIG. 1, there is the possibility of the rise in the potential of the highly doped well 20 due to a current and so on in the well because of pixel operation. Accordingly, if the highly doped well 20 is grounded as shown in FIG. 1, then the potential of the highly doped well 20 can be prevented from rising, and the potential barrier against the lowly doped substrate 11 can reliably be maintained. Although not shown in the figure, by grounding the highly doped well 20 together with the shading layer 16 in the shaded region, the fixation of the well potential as described above can easily be achieved in terms of layout.

Figure 3:
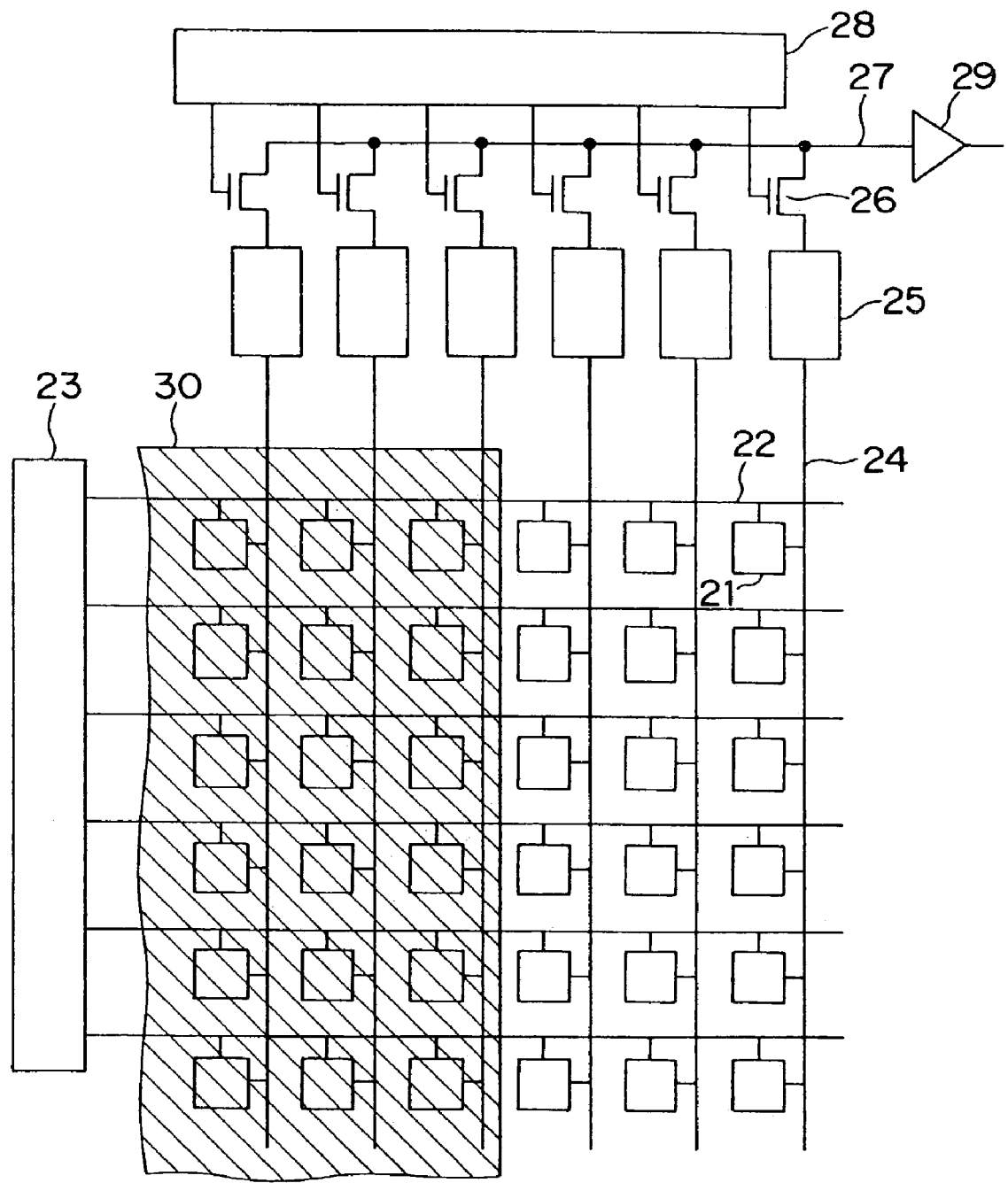
FIG. 3 is a circuit diagram of a solid-state imaging device where pixels are two-dimensionally arranged.
Figure 5:
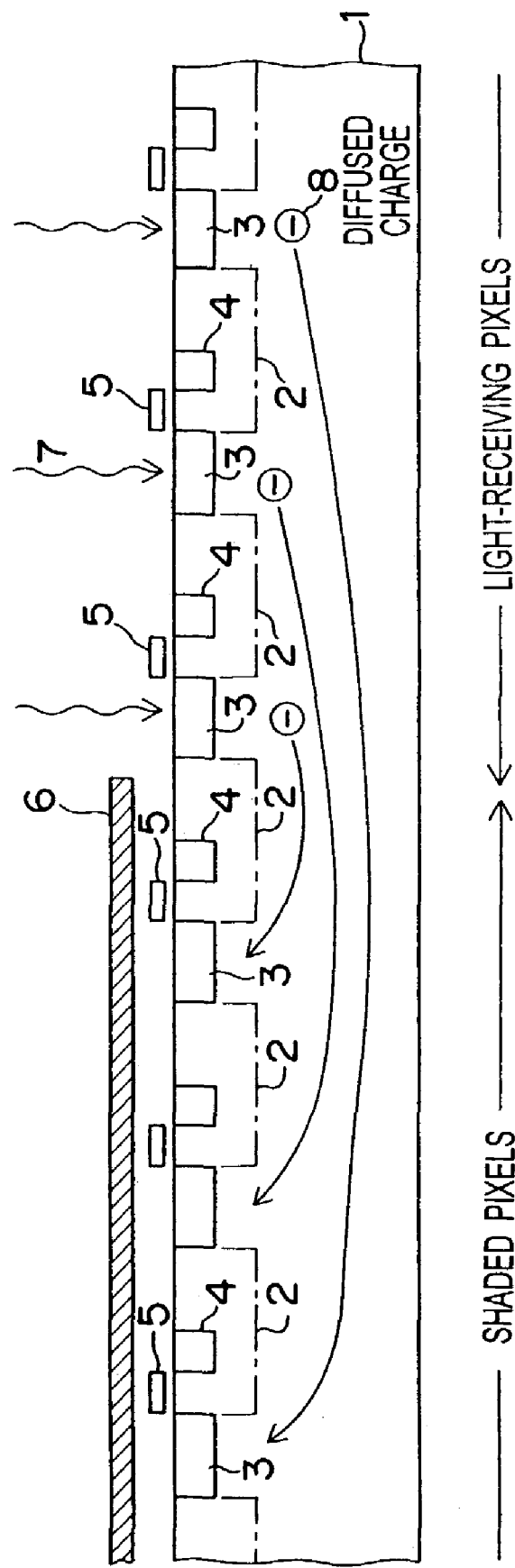
FIG. 5 is a sectional view showing the structure of a conventional CMOS type solid-state imaging device.
Figure 6A:
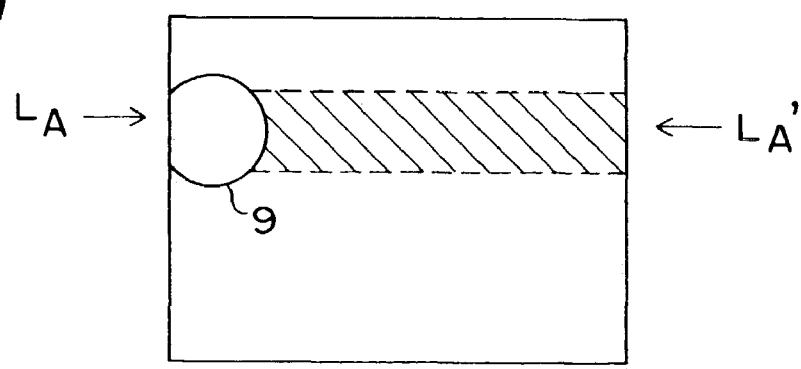
FIGS. 6A and 6B are explanatory views of an image defect of the conventional CMOS type solid-state imaging device shown in FIG. 5.
Figure 6B:
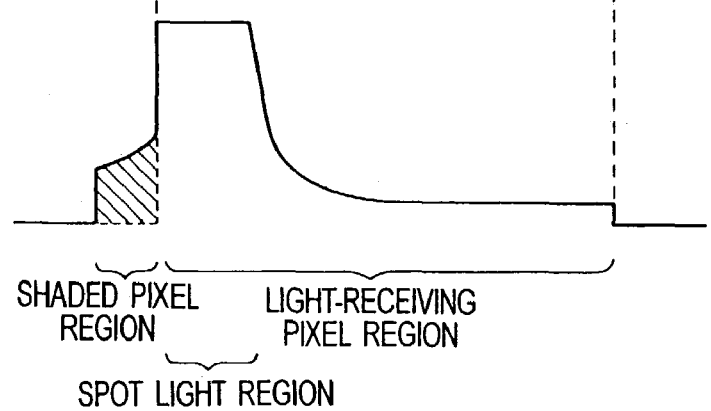

If a solid-state imaging device having a construction as shown in FIG. 1 is applied to shaded pixels covered with a shading layer 30 in a pixel array as shown in FIG. 3, then it is possible to use an output signal from the shaded pixels as a stable black reference signal that is not influenced by incident light and determine the DC level of the light-receiving pixel signal in horizontal lines. Therefore, the DC level of the light-receiving pixel signal does not fluctuate even when intense spot light is made incident on the light-receiving pixels, and the depression in black in the horizontal direction on the pickup image screen as shown in FIG. 6A can be prevented.

In the present embodiment as described above, the sources or drains 14 of the transistors and the photodiodes 13, which constitute the shaded pixels covered with the shading layer 16, are formed on the surface of the highly doped well 20 provided on the lowly doped substrate 11. Therefore, the potential barrier $\Delta V$ expressed by the equation (1) is formed extended from the lowly doped P$^-$-substrate 11 toward the highly doped P$^+$-layer well 20. Even if intense spot light is made incident on some of the light-receiving pixels and part of the light 17 reaches the neutral region of the lowly doped substrate 11, part of the diffused charges 18 photoelectrically converted there cannot intrude into the highly doped well 20. Therefore, the output signal level of the shaded pixels is not raised, and the black reference level can be maintained without causing the depression in black in the horizontal direction.

The direction, in which the shaded pixel array is arranged in the present embodiment, is not limited only to the direction of column of the pixel array shown in FIG. 3. Although not particularly shown, if shaded pixels are arranged in the direction of row in the vicinity of either one or both of both ends in the direction of column of the light-receiving pixel array, the shaded pixel signal from the shaded pixels arranged in the direction of column can also be stabilized without being influenced by the incident light. Moreover, by arranging the shaded pixels in both directions of column and row, the shaded pixel signal can be stably utilized for purposes other than the level determination processing in lines as in the case where the total level of the light-receiving pixels is determined.

Moreover, in connection with the aforementioned embodiment, there is exemplarily described the case where the light-receiving pixels and the shaded pixels are formed on the semiconductor substrate 11. However, the present invention is not limited to this, and the invention can also be applied to the case where the light-receiving pixels and the shaded pixels are formed on the surface of the superficial portion of the well, the epitaxially grown layer or the like constructed separately from the substrate main body portion on the surface side of the semiconductor substrate. In the above case, it is proper to cover the lower side facing the superficial portion of the photodiodes and the transistors of the shaded pixels with a highly doped well. In this case, since the thickness of the highly doped well is about 1 μm to the utmost, the superficial portion is required to have a thickness capable of covering this. As described above, a wafer, on which the well or the epitaxially grown layer is formed separately from the substrate main body, has a preferable feature that wasteful electric charges are less prone to diffuse in at least the surface portion in comparison with a wafer of a mere integrated type.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solid-state imaging device in which a plurality of pixels each comprised of a photodiode and a transistor are arranged on a surface of a semiconductor substrate, said plurality of pixels including light-receiving pixels having light incident on the respective photodiodes thereof and shaded pixels having no light incident on the respective photodiodes thereof, and in which a black reference level is obtained on the basis of an output signal from said shaded pixels, wherein
- a lower side of each of the photodiodes of said shaded pixels facing the semiconductor substrate is covered with an impurity layer having a conductivity type identical to that of the semiconductor substrate and has a concentration higher than that of the semiconductor substrate, and a lower side of each of the photodiodes of said light-receiving pixels facing the semiconductor substrate is in direct contact with the semiconductor substrate.

2. The solid-state imaging device as claimed in claim 1, wherein a lower side of the transistor of each of the
- shaded pixels facing the semiconductor substrate is also covered with the impurity layer, and
- a lower side of the transistor of each of the light-receiving pixels facing the semiconductor substrate is covered with another impurity layer that is of a conductive type identical to that of the semiconductor substrate and has a concentration higher than that of the semiconductor substrate.

3. The solid-state imaging device as claimed in claim 2, wherein
the impurity layer that covers the lower side of the shaded pixel has its whole area shaded by a shading layer and is separated from the impurity layer that covers the lower side of the transistor of the light-receiving pixels via a region of the semiconductor substrate.

4. The solid-state imaging device as claimed in claim 3, wherein
the shading layer that shades the whole area of the impurity layer that covers the lower side of the shaded pixels is grounded.

5. The solid-state imaging device as claimed in claim 1, wherein
the impurity layer that covers the lower side of the photodiodes of each of the shaded pixel is grounded.

6. The solid-state imaging device as claimed in claim 1, wherein
the shaded pixels are arranged in a direction of column in the vicinity of either one or both of both ends in a direction of a row of the light-receiving pixels arranged in a matrix form.

7. The solid-state imaging device as claimed in claim 1, wherein
the shaded pixels are arranged in a direction of a row in the vicinity of either one or both of both ends in a direction of column of the light-receiving pixels arranged in a matrix form.

8. A solid-state imaging device in which a plurality of pixels each comprised of a photodiode and a transistor are arranged on a surface of a superficial portion of a semiconductor substrate, said plurality of pixels including light-receiving pixels where light is incident on the photodiode and shaded pixels where no light is incident on the photodiode, and a black reference level is obtained on the basis of an output signal from the shaded pixels, wherein
at least a part of said superficial portion of the semiconductor substrate faces the photodiodes of the shaded pixels and serves as an impurity layer of a conductivity type identical to the conductivity type of the remainder of said superficial portion having a concentration higher than that of the remainder of said superficial portion, and a side of each of the photodiodes of each of the light-receiving pixels faces said remainder of said superficial portion of said substrate and is in direct contact with said remainder of said superficial portion of said substrate.

9. The solid-state imaging device as claimed in claim 8, wherein the superficial portion is constructed separately from a main body portion of the substrate on a surface side of the semiconductor substrate.

10. The solid-state imaging device as claimed in claim 9, wherein the surface portion is a well or an epitaxially grown layer formed on the surface side of the semiconductor substrate.

* * * * *